(12) United States Patent
Lerner (10) Patent No.: US 10,845,710 B2
(45) Date of Patent: Nov. 24, 2020

(54) GEOMETRICALLY SHAPED COMPONENTS IN AN ASSEMBLY FOR A TRANSFER PRINT AND ASSOCIATED METHODS

(71) Applicant: X-FAB SEMICONDUCTOR FOUNDRIES GMBH, Erfurt (DE)

(72) Inventor: Ralf Lerner, Erfurt (DE)

(73) Assignee: JPMORGAN CHASE BANK, N.A., New York, NY (US)

( * ) Notice: Subject to any disclaimer, the term of this patent is extended or adjusted under 35 U.S.C. 154(b) by 0 days.

(21) Appl. No.: 15/951,449

(22) Filed: Apr. 12, 2018

(65) Prior Publication Data

US 2018/0373160 A1    Dec. 27, 2018

(51) Int. Cl.
| | |
|---|---|
| *H01L 23/00* | (2006.01) |
| *H01L 21/78* | (2006.01) |
| *H01L 21/306* | (2006.01) |
| *H01L 21/48* | (2006.01) |
| *H01L 21/768* | (2006.01) |
| *H01L 23/498* | (2006.01) |
| *G03F 7/20* | (2006.01) |
| *G06F 30/392* | (2020.01) |

(52) U.S. Cl.
CPC ........ *G03F 7/70433* (2013.01); *G06F 30/392* (2020.01); *H01L 21/30604* (2013.01); *H01L 21/486* (2013.01); *H01L 21/76816* (2013.01); *H01L 21/7806* (2013.01); *H01L 23/49827* (2013.01); *H01L 23/49838* (2013.01); *H01L 24/00* (2013.01)

(58) Field of Classification Search
None
See application file for complete search history.

(56) References Cited

U.S. PATENT DOCUMENTS

| | | | |
|---|---|---|---|
| 4,542,397 A | 9/1985 | Biegelsen | |
| 6,420,266 B1 | 7/2002 | Smith et al. | |
| 7,799,699 B2 | 9/2010 | Nuzzo et al. | |
| 7,932,123 B2 | 4/2011 | Rogers et al. | |
| 7,943,941 B2 | 5/2011 | Nuzzo et al. | |
| 8,664,699 B2 | 3/2014 | Nuzzo et al. | |
| 9,373,772 B2 | 6/2016 | Huminic et al. | |
| 2005/0054153 A1* | 3/2005 | Asami ................. | B81C 1/00619 438/202 |
| 2007/0164306 A1 | 7/2007 | Nakahata et al. | |
| 2009/0294803 A1 | 12/2009 | Nuzzo et al. | |
| 2011/0039397 A1 | 2/2011 | Zhu et al. | |
| 2011/0136296 A1* | 6/2011 | Koo .................... | H01L 21/6835 438/106 |

(Continued)

FOREIGN PATENT DOCUMENTS

| | | |
|---|---|---|
| DE | 112011101135 | 3/2013 |
| JP | 6481328 A | 3/1989 |

*Primary Examiner* — Herve-Louis Y Assouman
(74) *Attorney, Agent, or Firm* — Greenberg Traurig LLP (57) ABSTRACT

The invention relates to a geometric design and corresponding methods for components 22, which are produced on a carrier substrate 10 and prepared by detachment in an etching process 30 for a subsequent absorption and a transfer with a stamp for application to a further substrate. The components 22 are designed in such a way that additional active surfaces are provided for the etching process 30 for undercut the components, so that a faster, more reliable and more homogeneous etching profile is achieved.

15 Claims, 6 Drawing Sheets

(56) References Cited

U.S. PATENT DOCUMENTS

2012/0107994 A1\* 5/2012 Taya .................. B81C 1/00476
  438/53
2013/0069275 A1 3/2013 Mendard et al.
2016/0187371 A1\* 6/2016 Sakai .................... G01P 15/125
  73/514.32

\* cited by examiner

GEOMETRICALLY SHAPED COMPONENTS IN AN ASSEMBLY FOR A TRANSFER PRINT AND ASSOCIATED METHODS

TECHNICAL FIELD

The present invention relates to the technical field of transferring components, e.g. semiconductor components, from a carrier substrate, on which the components are produced, to a further substrate to which the components are applied, and on which they may optionally also be further processed.

BACKGROUND

In the technical field of producing micro-electronic, micro-optical, micro-mechanical components, which will here be jointly referred to as components produced by micro-processing or micro-structuring, efforts are made to constantly improve by means of efficient process techniques both the production process itself and the performance of the thus produced micro-processed components. One technique in this respect is the so-called transfer print, in which semiconductor components are produced on a first carrier substrate, e.g. a semiconductor wafer, and are subsequently released therefrom, e.g. by making use of a suitable stamp for taking up the previously produced semiconductor components that have been etched free at least partially. Subsequently, the components adhering to the stamp can be applied at a suitable position to a second substrate, which may also be configured as a semiconductor wafer, and optionally subjected to further processing.

U.S. Pat. No. 6,420,266 B1 (by Smith et al) discloses a component assembly on a carrier substrate, comprising a plurality of components produced from a semiconductor material on the carrier substrate. The components are arranged as a two-dimensional field on the carrier substrate and separated from one other by separation trenches, which are etched vertically into the component assembly. For separating the components from the carrier substrate, a layer extending below the components is etched away between the ends of the separation trenches by means of selective lateral etching.

US 2011/0039397 A1 (by Zhu et al) relates to a method for separating chips or ICs from a wafer. In order to save area and manufacturing costs, deep trench formation is combined with mechanical bending or lateral etching to separate chips or ICs from a wafer. To this end, the method of separating integrated circuit chips from a semiconductor wafer comprises forming parallel, substantially vertical trenches in the semiconductor wafer, forming etch-resistant spacers on the side walls of the vertical trenches, forming extensions of the vertical trenches, etching lateral channels from the extensions of the vertical trenches, and separating the integrated circuit chips from the semiconductor wafer.

US2009/0294803 A1, DE 11 2011 101 135 T5 and U.S. Pat. No. 8,664,699 B2 illustrate techniques for realizing the transfer print, which allow semiconductor components to be transferred from a first semiconductor wafer to a new substrate by means of a stamp of elastomeric material. This new substrate may also be a further semiconductor wafer. For this purpose, the components to be transferred are first masked by suitable masks, e.g. resist layers, and the like, and are then laterally etched free by producing etched trenches. This etching step involves etching around the respective component except for small so-called breakable connection elements, so that a weak mechanical contact to adjacent components is maintained. In a next etching step, the area below the component is etched free, i.e. the component is fully under etched, the mechanical fixing of the under etched components being accomplished by the connection elements. Subsequently, part of the components is, according to the size of the stamp, brought into conformal contact with the surface of the stamp and is detached from the first semiconductor wafer through adherence to the stamp. During this process, the connection elements maintaining the mechanical contact are finally destroyed, so that complete separation is possible. Then, the components adhering to the stamp are brought into conformal contact with the target substrate and fixed there in a suitable manner.

This technical process allows special semiconductor components in the form of GaN transistors to be transferred from the first semiconductor wafer to a second semiconductor wafer during each stamping process. The semiconductor wafers may here differ as regards their type of material and/or their crystal orientation and/or their wafer diameter and/or their wafer thickness, so that the semiconductor wafers can be selected separately for the production of the respective components and for connecting the latter to optional other circuits later on.

After transfer printing, further semiconductor-process processing steps may be carried out, e.g. by applying insulation layers and/or conductive layers. These processes can be carried out on the basis of the entire semiconductor wafer, so that the full-area deposition process and the subsequent structuring allow very efficient processing and thus a cost-effective production by parallel processing of a large number of semiconductor components in the same production step. For example, GaN transistors with high electron mobility, which have been transferred making use of the above-described technique, can be covered by means of an insulating layer, which is then structured such that it has contact openings that are filled with a conductive material in a suitable manner, so that the previously transferred semiconductor components can be wired as desired.

U.S. Pat. No. 7,932,123 B2 discloses methods in the case of which a plurality of so-called "release layers" is used for rendering the functional structures "printable".

U.S. Pat. No. 7,943,491 B2 and US 2013/0069275 A1 describe a kinetically controlled process, in which, by means of the separation speed, the adhesion forces occurring between a component to be transferred and the stamp can be varied, so as to first hold the component to be transferred on the stamp and then fix the component on the receiver substrate once and for all. High adhesion forces are thus generated during rapid separation, so that the components will be attached temporarily to the stamp and can be released from the donor substrate, while the subsequent low separation speed and the resultant low adhesion forces allow the components to be released from the stamp and applied to the target substrate.

U.S. Pat. No. 7,799,699 B2 describes how AlGaN/GaN hetero components are etched free on a (111) silicon substrate. Through suitable masking and vertical etching by an inductively coupled plasma, exposed, i.e. non-masked, trenches are etched next to the component. In a horizontal direction, i.e. in the direction of underetching, the components are then etched free by etching with tetramethylammonium hydroxide (TMAH) of the silicon substrate and thus released from the carrier substrate. Mechanical fixing in the horizontal direction is here accomplished by suitable interruptions of the trenches, i.e. by material webs forming the connection elements that are not etched during the etch process.

In the production of components produced by microprocessing, e.g. in the form of electronic components, circuits and the like, these components are typically configured to be rectangular, so as to obtain continuous scribe lines or dicing streets. JP S 64 81328 A, however, describes that the circuits are geometrically designed as octagonal chips, so as to allow uniform wiring.

U.S. Pat. No. 9,373,772 B2 describes a method, according to which a membrane provided with openings is applied to a substrate. In the case of this method, a first resist mask is used for subjecting a first area of the substrate to isotropic etching through the openings of the membrane, after anisotropic etching has already been carried out from the back. By means of a second resist mask, a further part of the substrate is then subjected to isotropic etching.

In general, the above-mentioned processing techniques for the transfer of components produced on a respective semiconductor substrate offer many advantages as regards rendering the entire production process more flexible, since, for example, special components, e.g. transistors, or entire switching element blocks are produced on a suitable substrate on the basis of suitable materials and associated processing techniques, while other component areas are produced, e.g. by means of well known CMOS techniques, and are then provided with the previously produced and transferred components.

FIG. 1 to 5 show typical processes used in the production of component assemblies, in which components are produced on a carrier substrate A and then released therefrom for transfer to a further carrier substrate B.

Figure 1:
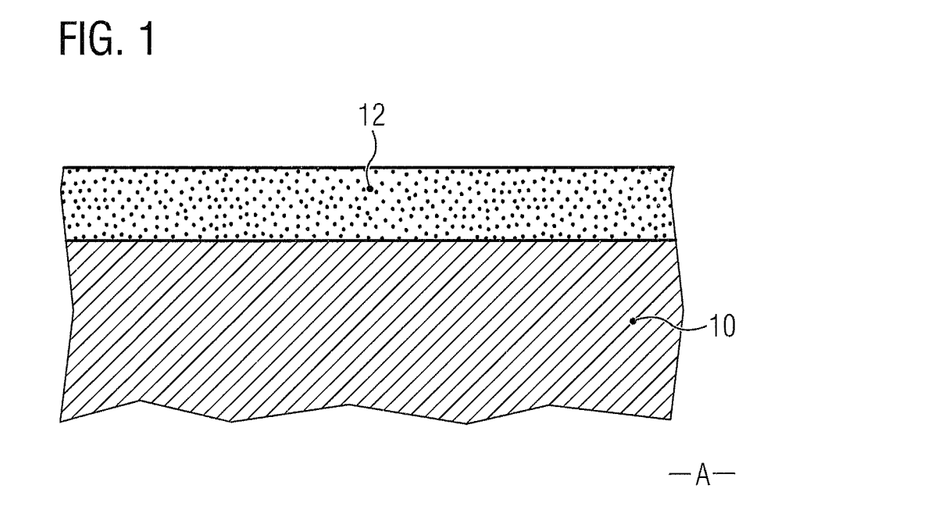
FIG. 1 is a schematic cross-sectional view of a carrier substrate A with an active layer 12 for structural elements or components.

FIG. 1 shows a schematic cross-section of a first semiconductor wafer, which is composed e.g. of a carrier substrate 10 and an active component layer 12. The active component layer 12 is typically a suitable semiconductor material, e.g. in the form of an AlGaN/GaN hetero epitaxial layer, suitable for producing e.g. high-performance transistors. This component layer 12 is located on the carrier substrate 10, which is suitably configured such that the layer 12 can be produced thereon or applied thereto. For example, the carrier substrate 10 may be a (111) silicon layer, or the active layer 12 may be the semiconductor material of an SOI (silicon- or semiconductor-on-insulator) wafer. In and on the active component layer 12, a plurality of components is produced by suitable production processes. These components are to be transferred later on to a further substrate, e.g. a further semiconductor wafer, by means of transfer printing. Instead of a single component part, e.g. a single transistor, also a large number of such component parts are often produced as a component, e.g. in the form of an integrated circuit, and then transferred to the desired target substrate by means of transfer printing.

Figure 2:
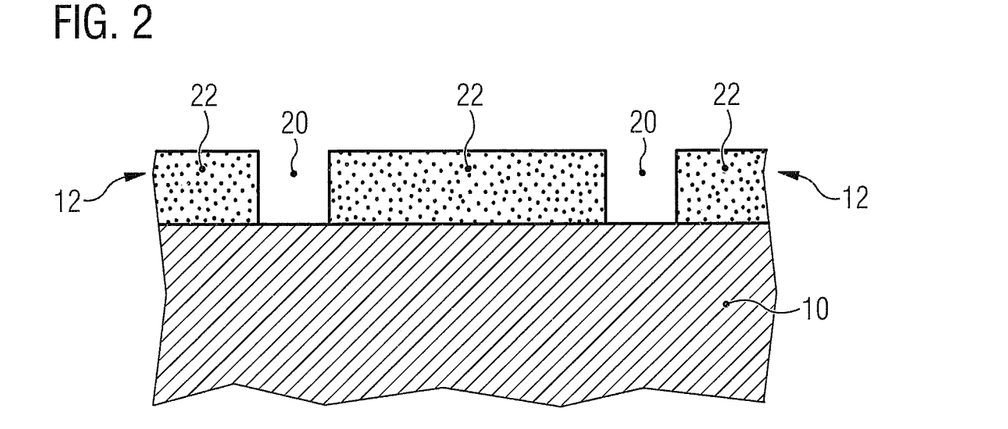
FIG. 2 shows etched trenches 20 between components 22 on the carrier substrate in a cross-sectional view.

FIG. 2 shows the entire assembly in a more advanced production stage. As shown, fully processed components 22 are formed on the carrier substrate 10, e.g. each in the form of a single component or a few electronic, optical, mechanical components, or also as more or less complex groups of micro-processed components, for example as complete circuits, the individual components 22 being separated from one another by etched trenches 20. At the bottom of the etched trenches 20, the carrier substrate 10 is accessible for further etching steps.

Figure 3:
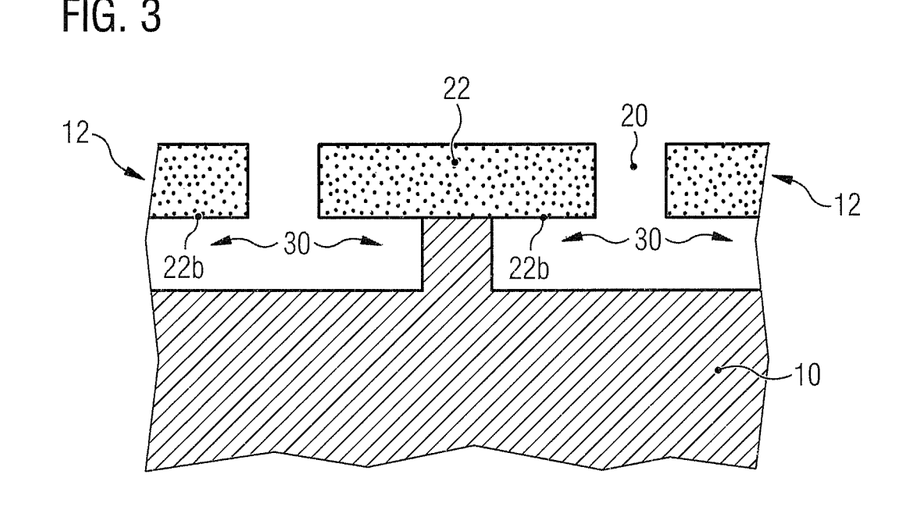
FIG. 3 shows the assembly according to FIG. 2 in an advanced stage of the etch process for releasing (exposing) the components 22 in the cross-sectional view.

FIG. 3 shows the arrangement during an etch process 30, which is carried out via the etched trenches 20 in such a way that, among other things, an efficient horizontal removal of material is obtained, so that during the etch process 30 the bottom 22b of the components 22 will gradually be etched free. For the sake of simplicity, respective mechanically retaining material webs (so-called connection elements) are not shown, these material webs continuing to mechanically fix adjacent components 22 to one another to a certain extent.

Figure 4:
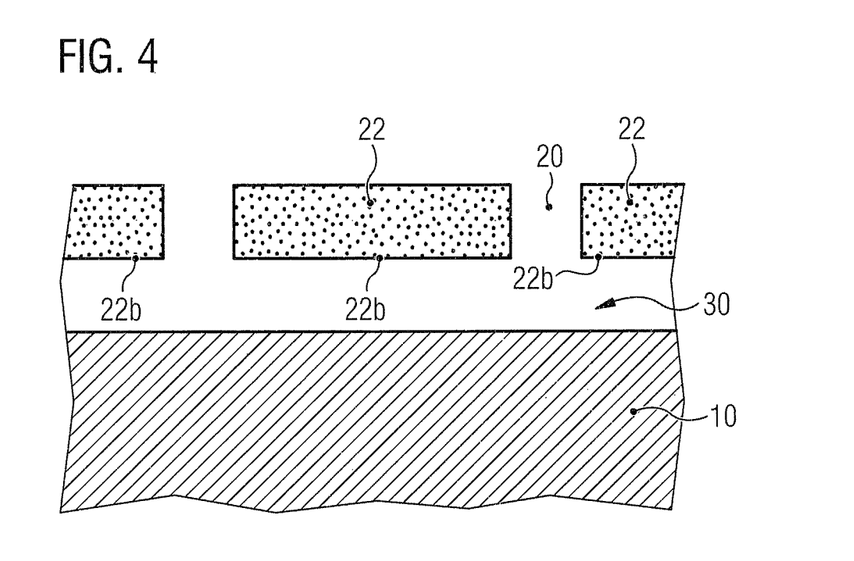
FIG. 4 shows the carrier substrate in a cross-sectional view in a condition in which the components 22 have been fully etched free on the bottom surface 22b thereof.

FIG. 4 shows the assembly of a phase in which the etch process 30 resulted in complete underetching of the components 22, so that, with the exception of connection elements, which are not shown, the components are fully detached from the carrier substrate 10 and can thus be separated mechanically from the carrier substrate.

Figure 5:
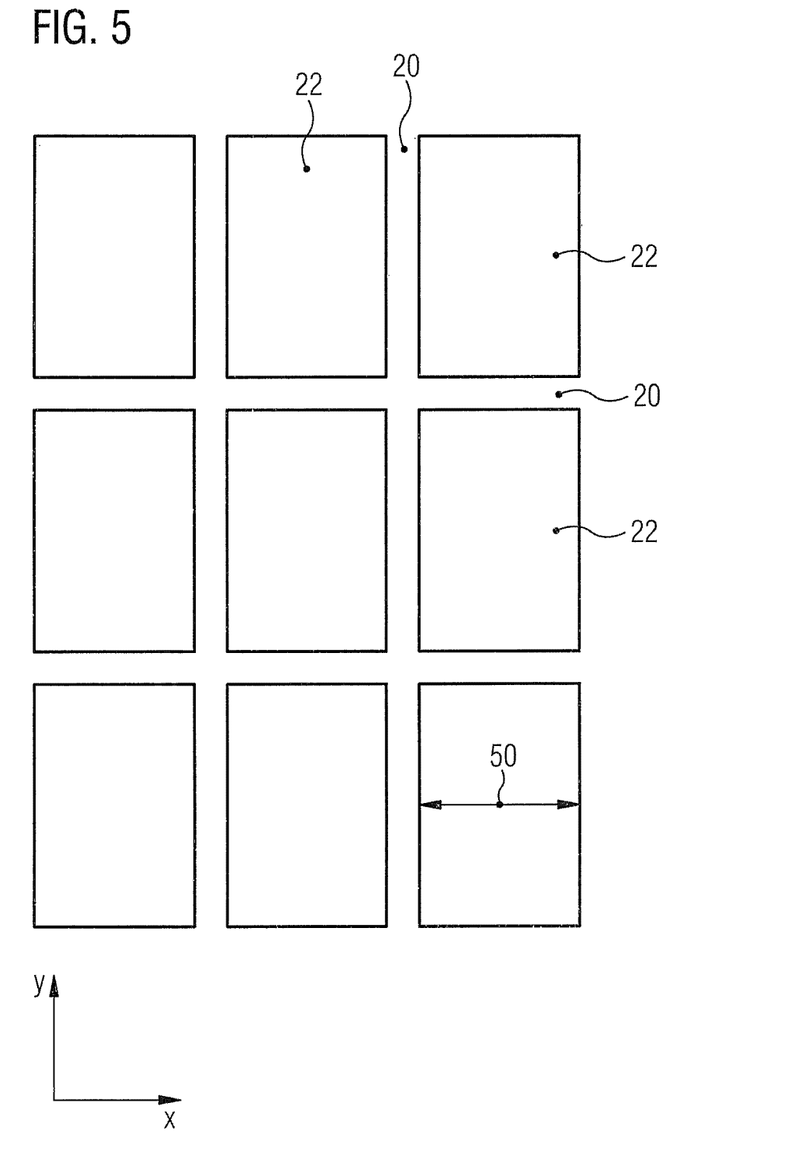
FIG. 5 shows components 22 arranged in a field with etched trenches 20 therebetween (in a top view).

FIG. 5 shows a schematic top view of a component assembly comprising nine components 22 (9 in the present example), these components 22 being, separated by the etched trenches 20, oriented as a field in a vertical and in a horizontal direction. The etch process 30 described above must therefore overcome at least the short lateral dimension of the components 22, so as to lead to a complete exposure of the respective bottom 22b and thus to a detachment of the plurality of components 22 of a field, as described above. In the variant shown, the minimum lateral dimension is given in the horizontal direction of FIG. 5, since the components 22 typically have a rectangular shape and the shorter "length", which will here also be referred to as "width", thus specifies the minimum distance to be under etched. In the present case, this distance or width is identified by 50.

It follows that, with increasing horizontal dimensions of the semiconductor components, e.g. in the case of differently shaped components 22, also the horizontal free etching, e.g. the etching of a silicon substrate by means of a TMAH-based etchant, must cover a longer distance under the component, as has also been described hereinbefore. The required etching times will thus become longer, whereby an increase in the overall production costs will be caused. In addition, a reduction of the etching speed or even a complete standstill of the etch process may occur, since the effective area for the etch process is given only by the narrow gap of the etched trench, whereby a depletion of the etchant (or its reduced effectiveness due to the consumption of the etching-active components) may occur in these areas, and this may even have the effect that the etch process comes to a standstill. Such situations are typically predetermined by the circumstances of the etching system, so that the possible size of the components to be etched free is limited. Enlarging (in the sense of widening) the etched trenches so as to accomplish a better replacement of the depleted etching solution by a new, more active etching solution is not an advantageous solution, since it leads to a reduction of the available area on the carrier substrate (the primary carrier).

SUMMARY OF INVENTION

In view of the above-mentioned situation, there is a need in the prior art to allow an efficient transfer printing technique comparatively independently of the size of the components to be transferred, especially in the context of detaching or releasing (exposing) components, which are to be transferred, from the primary carrier.

According to the present invention, this is achieved with a component assembly as an assembly of geometrically configured components, a method of producing a component assembly or a method of separating components from a carrier substrate.

The concept used is to allow the process of etching free not only from the edge of a component, but to provide also further effective areas by a geometric design of the components, so that the etching required during the etch process for detaching a respective component has to cover a shorter distance. The time required for the whole underetching process can thus be reduced.

The invention therefore provides a new assembly of components on a carrier substrate. The component assembly comprises a plurality of components, which, processed from semiconductor material, are built on the carrier substrate and oriented as a two-dimensional field in a first lateral direction and a second lateral direction of the carrier substrate, the second lateral direction being perpendicular to the first lateral direction. The new geometric design of each of the plurality of components provides at least one—laterally oriented—opening in each component to increase the effective area for underetching each of the plurality of components for releasing them from the carrier substrate.

"Each" component is to be understood such that it refers to all those components that are to be exposed for subsequent transfer to the secondary carrier. Those components which remain without a lateral opening because they are only provided for avoiding the wording, but are not to be etched free, detached, released or exposed for the purpose of transfer, are not meant/covered by this wording.

In this way, a certain effective area is also provided in the "interior" of the components, so that a "two-sided" etching attack can occur simultaneously in more than four lateral sections of each of the components to be transferred, to thus reduce the etching time required for detaching.

According to a further embodiment, the at least one opening is provided such that it subdivides the component into sections extending respectively in the first or in the second direction and delimited in their direction of extension by an outer edge section of the component and an opposed edge of the at least one opening. It follows that the at least one opening is arranged in the component such that the resultant sections are each delimited by an outer edge of the component and an edge section of the (at least one) opening. This structural design substantially reduces the respective "widths" of the resultant sections in comparison with a minimum overall dimension of the component (its overall width).

According to an illustrative embodiment, a distance between a respective delimiting outer edge section and the opposed edge of the at least one opening is, for each section, not larger than half the minimum total dimension of the component.

In this context, a "minimum overall dimension" of the component is to be understood as a dimension in one of the two mutually perpendicular lateral directions along which the field of the components is oriented, such that the respective smaller dimension, e.g. the smaller length of a rectangle, is regarded as the minimum dimension that can also be referred to as "width". In the case of this embodiment, the at least one opening is dimensioned and positioned such that, for all the above specified sections of the component under consideration, an etching time is obtained, which is equal to or less than the time corresponding to half the width of the component in question, whereby the etching time will be reduced significantly.

Here, too, the observation will concern a component that is intended for exposure and transfer printing, and will then be transferred to all components intended for transfer printing. In particular, the detachment of the components from the carrier substrate (called "A") is managed efficiently, so that, for example, components with a larger total area can reliably be detached and transferred to a further carrier substrate (called "B") in existing etching systems or with known etching strategies.

According to a further embodiment, two neighboring components are separated by an etched trench having a predetermined nominal width. Typically, the nominal width may here be selected such that, on the one hand, it conforms to the etching technology used, and, on the other hand, also leads to the desired minimum dimensions that are required for subsequently etching free the components. However, due to the additional effective areas for the etch process for underetching the components, the widths of the etched trenches may generally be smaller, if necessary, since the demands on the etch process are significantly less strict due to the additional effective areas, and since, consequently, e.g. the exchange of etchants on the etch front can take place with higher reliability during the etch process in order to prevent the etch process from stopping.

According to a further embodiment, a minimum dimension of the at least one opening corresponds to the nominal width of the etched trench. Also in this case, the minimum dimension is to be understood as the smaller one of the two dimensions in the mutually perpendicular lateral directions. It follows that, in this embodiment, a uniform target value can be defined for both the etched trenches and the openings, so that, for example, practically identical etching conditions will prevail both in the opening and in the etched trenches, whereby a higher degree of predictability as regards the course of the etching process is given. For example, respective etching ratios may be modelled and/or experimentally examined in order to determine e.g. a minimum target dimension, thus ensuring, on the one hand, a reliable etch process and allowing, on the other hand, a maximum utilization of the area of the carrier substrate.

According to advantageous embodiments, the plurality of components are, when seen in a top view, respectively configured in an O-shape or a U-shape or an H-shape. These geometric designs can be created by one or two or a plurality of openings per component, so that respective additional large effective areas are provided for the etching attack. The terms O-shape, U-shape, H-shape are to be understood as typically referring to a combination of straight sections, which have a similarity to the letters in question, without having to be an exact replica of the shapes of these letters.

These shapes may be rounded off on corner areas due to manufacturing tolerances and the like. On the other hand, these terms also describe rounded shapes, if this is compatible with the manufacturing techniques used for producing the micro-processed component parts in the respective components. Such roundings are typically produced by means of small rectilinear subsections, so that, depending on the respective resolution, the roundings in question, if provided, are perceived as more or less stepped rectilinear areas.

According to further illustrative embodiments, each component is subdivided into two or more parts, each of which may have one of the above specified shapes. In this way, components can be designed, which are a combination of several U-shaped configurations. The respective U-shapes, when aligned in a line, may be arranged inversely to each other in the respective other lateral direction, or a combination of U-shaped and/or O-shaped and/or H-shaped configurations may be provided. In addition, a plurality of similar shapes may be provided as the respective parts of a single component, so as to allow an even more extensive provision of effective areas within a single component.

According to another aspect, a method of producing a component assembly is provided. In the case of this method, a plurality of components are produced on a carrier substrate by executing micro-structuring processes. In addition, etched trenches are produced between the plurality of components, and at least one opening is produced in each of the plurality of components for enlarging the effective area when underetching of the components is carried out so as to release them from the carrier substrate.

Also according to this aspect, the same advantages, which have already been specified hereinbefore for the component assembly itself, are achieved.

According to a further advantageous embodiment, a maximum target dimension is specified, which is to be etched during underetching of the components. The at least one opening is produced such that each section resulting from the production of the at least one opening has a width that is smaller than the maximum nominal width.

It follows that a suitable target dimension can be specified, which corresponds to a maximum width to be etched as a distance during the etching process. This target dimension can be specified with respect to characteristics of the etching system equipment, the total etching time and the like, and the openings can then be produced, with due regard to the previously ascertained target dimension, in such a way that none of the resultant sections will have a width greater than the maximum target dimension. In this way, an extremely homogeneous etching in combination with a reduced etching time can be accomplished.

In this context, the maximum target dimension should, advantageously, not be larger than half the minimum overall dimension of one or of each of the components. It will thus be guaranteed that, specifying, for example, half the minimum dimension, i.e. half the minimum width of the components, the etching time will be optimally utilized, since essentially all the sections involved will be fully etched in almost the same time.

According to a further embodiment, a component area required for producing one of the components on the carrier substrate is determined. Subsequently, an opening area of the at least one opening is determined, and a total area comprising the component area and the opening area and a shape adapted thereto are determined. Each component is produced on the basis of the determined total area and the adapted shape.

Typically, a plurality of individual component parts are comprised in components, so that, for producing these components, a certain minimum area on the carrier substrate is required, which corresponds at least to the base area of a single component part multiplied by the number of component parts.

Hence, the specification of this minimum required area and its shape corresponds to the required component part area.

Furthermore, the area required for the opening is determined in order to obtain in this way a total area of the component. This total area may e.g. be slightly larger in comparison with a conventional assembly in which no opening is provided for enlarging the effective areas. However, the increase in size can be kept comparatively small by arranging the individual component parts in an appropriate manner, so that the respective increase in area may even be compensated to a certain degree or even overcompensated by reducing the areas of etched trenches. When a suitable total area with a suitable shape has been ascertained, the corresponding production can be carried out on the basis of these design values.

In this way, the etching behavior can already be optimized in advance, taking into account a total area required for the functionality of the component.

According to a further aspect, a method of separating components from a carrier substrate is provided. The method comprises the production of a component assembly comprising a plurality of components on the carrier substrate as well as the production of etched trenches between the plurality of components and of at least one opening in each of the components so as to enlarge an effective area for an etchant. Finally, at least a bottom surface of the plurality of components is etched free by the action of the etchant via the etched trenches and the at least one, preferably two, opening(s) in each of the components.

It follows that, in this process, in which the components are actually detached from the carrier substrate at least on their bottom surface, the advantageous effects of an enlarged effective area can be realized in a suitable manner during the etching process. These advantageous effects have also been described hereinbefore.

If two openings are used, they extend preferably parallel to the largest total dimension of a component. On the other hand, the two openings are delimited such that they do not contact each other, i.e. a web remains between them. The web connects two sections of the original component before the two openings have been formed in the latter.

The geometric design of each of the plurality of components may advantageously be configured such that the respective component has formed therein at least one opening so as to form further effective etching areas. The "further effective etching areas" during the etching attack are added to the normal areas disclosed by the prior art. This leads to extended deep etching or extended underetching or to both extended etching options in the case of each of the plurality of components. From the structural point of view, each component located in the field and "extended in the interior thereof by an opening" is thus adapted for faster etching-free or faster release from the carrier substrate.

BRIEF DESCRIPTION OF THE FIGURES

Further advantageous embodiments are specified in the subclaims and are also disclosed by the detailed description following hereinafter, when the latter is studied with reference to the drawings. FIG. 1 to 5 represent prior art.

DETAILED DISCLOSURE

Making reference to the figures, illustrative embodiments will now be described in more detail; it should be pointed out that also FIG. 1 to 5 will be referred to. In particular, like reference numerals will be used for like components throughout the figures.

Figure 6:
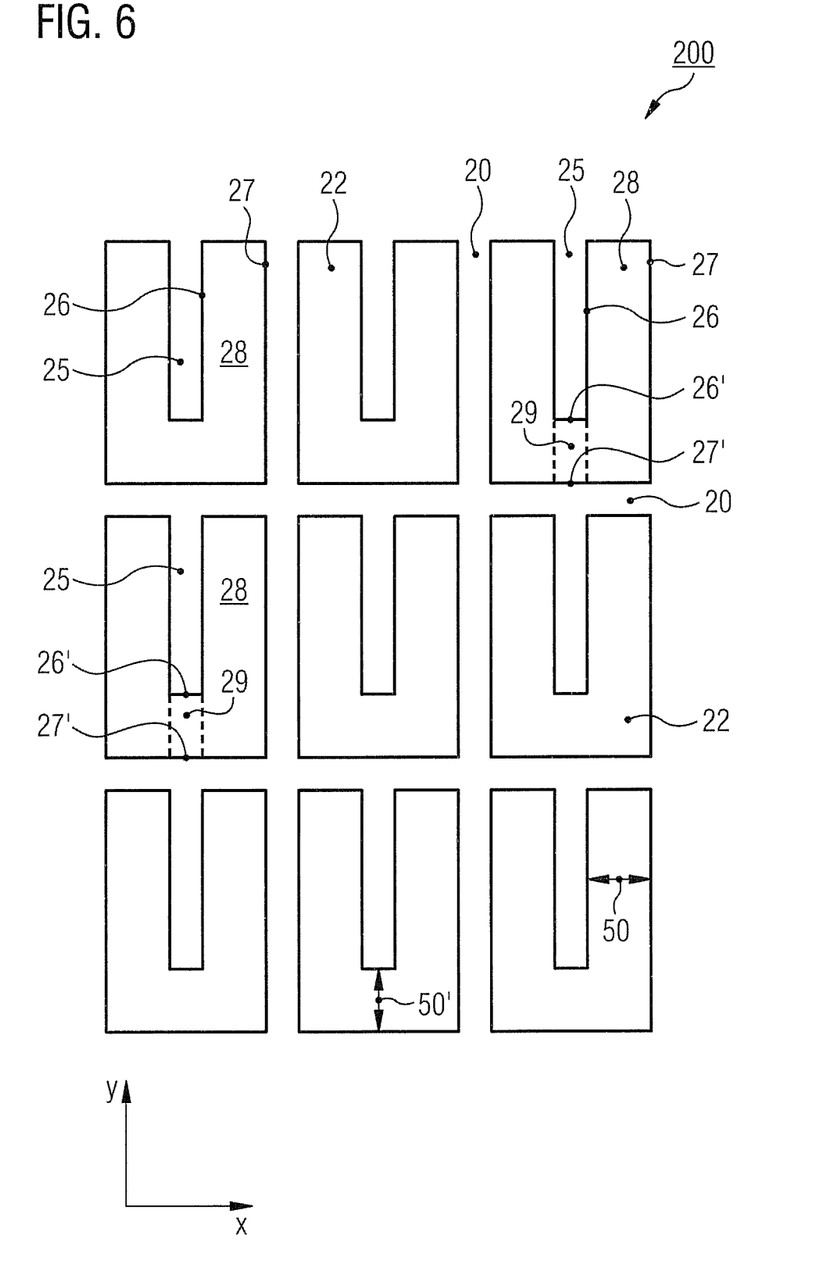
FIG. 6 shows an embodiment of a component assembly 200 according to a first illustrative embodiment of the invention as a U-shape of the components 22.

FIG. 6 shows an embodiment, in which a component assembly 200 defined by a plurality of components 22 is shown in the form of a field oriented in two lateral directions that are perpendicular to each other. As has already been explained in connection with FIG. 5, a lateral direction for the orientation of the component assembly 200, which is defined by the components 22, is the horizontal direction in FIG. 6, and the second lateral direction, which is perpendicular thereto, is the vertical direction in FIG. 6. The field lies in the x-y plane. In the 3D wafer this would be the wafer surface or parallel thereto.

As shown, each component 22 has an opening 25 formed therein, which provides additional effective areas in the form of edge surfaces of the opening 25 in the "interior" of the component 22. The additional "outer" effective areas result from etched trenches 20, which are also used in conventional techniques as effective areas and thus as points of attack for the etch process, as described in connection with FIG. 5 above.

In the embodiment shown, the opening 25 is dimensioned and arranged such that a U-shape is created in each of the components 22. Due to the etched trenches 20, outer edge sections 27 for the respective components 22 are formed, which serve as surfaces of attack for the etch process. On the other hand, the opening 25 has edge sections 26, 26', which also serve as effective areas and surfaces of attack, respectively.

The arrangement of each opening 25 is configured such that sections 28 are formed, which are respectively delimited and bordered in an extension direction, e.g. the horizontal x-direction in FIG. 6, by an edge section of the opening 25, e.g. the edge section 26, and an outer edge section of the component 22, e.g. section 27. The same applies, for example, to a section 29, which is delimited in its extension direction, i.e. in the vertical y-direction of FIG. 6, by an edge section 26' of the opening 25 and by a respective piece of the outer wall section designated as 27'.

The resultant sections, e.g. sections 28, 29, thus have an effective width for the etching attack, which is determined by the respective spacing of the sections in question, i.e. 26 and 27 on the one hand and 26' and 27' on the other, this width being significantly smaller than the width (as the minimum overall dimension) of a rectangular component 22 having no opening 25, of the type shown e.g. in FIG. 5.

The width 50 shown in FIG. 6, which corresponds to the etching width of section 28, is significantly reduced in comparison with conventional components, which do not have the geometric design 25. In this way, a significantly reduced etching time is accomplished, as has been explained in detail hereinbefore.

The effective width 50' of the y-section 29 results from the distance between 26' and 27'.

According to an advantageous embodiment, the width of the opening 25 is chosen such that it corresponds to the width of the etched trenches 20, so as to achieve a very homogeneous course of the etch process, as explained above.

The component assembly 200 composed of the components 22 according to FIG. 6 can be produced in a similar way, as has also been described above in connection with FIG. 1 to 5. This means that, starting from the configuration shown in FIG. 1, the components 22 are produced in a modified geometric design in comparison with the rectangular components 22 of FIG. 5 according to the required micro structuring steps. Upon arranging individual non-depicted components, e.g. transistors as functional elements, it is to be ensured, as explained above, that these components are not positioned in the area associated with the opening 25.

After completion of the components 22, the etched trenches 20 and the openings 25 will then be produced, advantageously in the same etch process, so that the configuration shown in FIG. 6 will be obtained.

Further processing can then be continued such that a suitable etch process is executed, by means of which complete underetching 30 of the components 22 and thus a detachment of the bottom 22b from the carrier substrate 10 is accomplished, as is also shown and described in connection with FIG. 4 for conventional components. During this etch process 30 for completely releasing the bottom surfaces 22b of the components 22, the additional effective areas lead to a significant reduction of the etching time as well as to a homogeneous course of the entire etch process.

Figure 7:
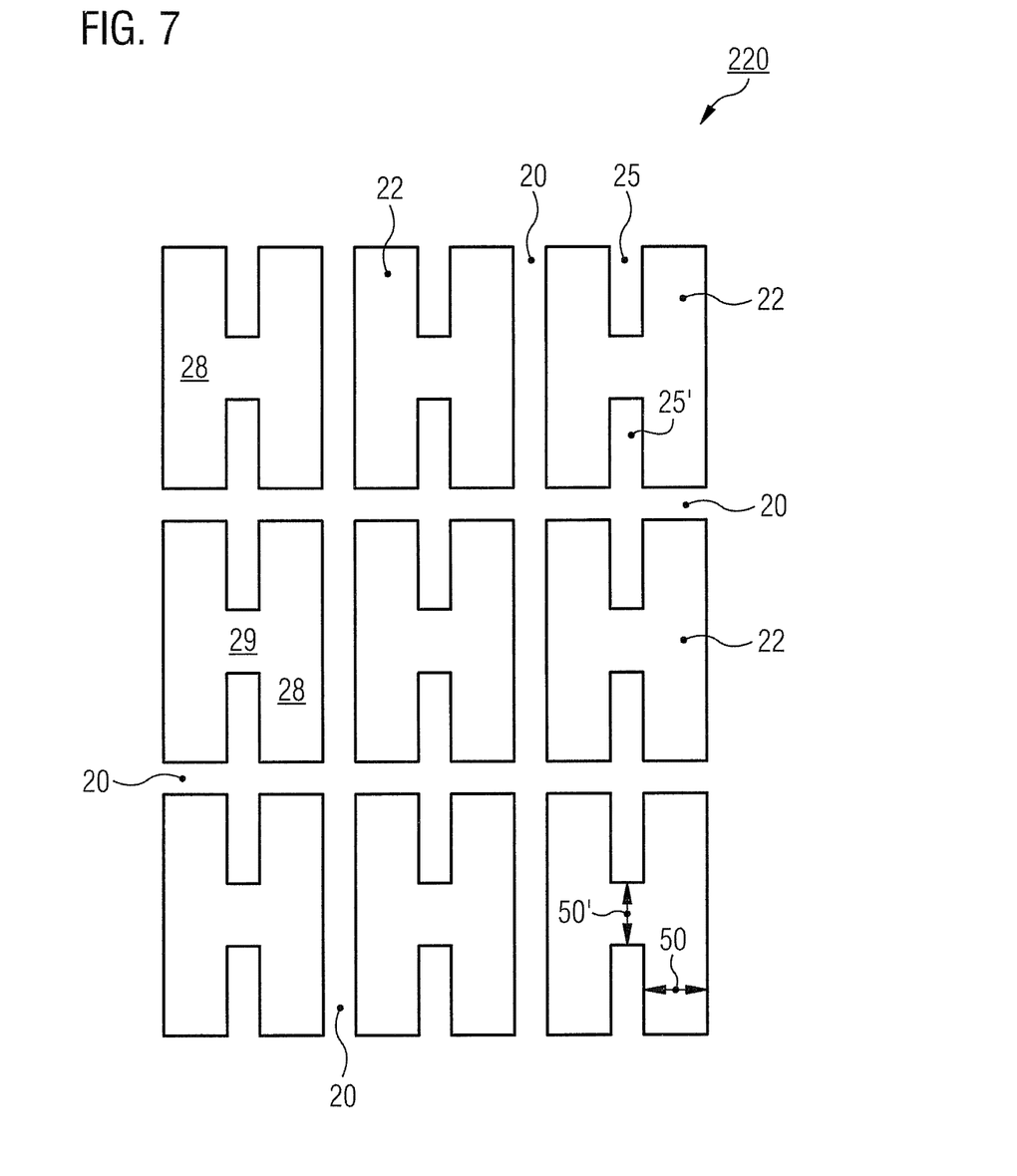
FIG. 7 shows a component assembly 220 according to a further illustrative embodiment in an H-shape of the components.
Figure 8:
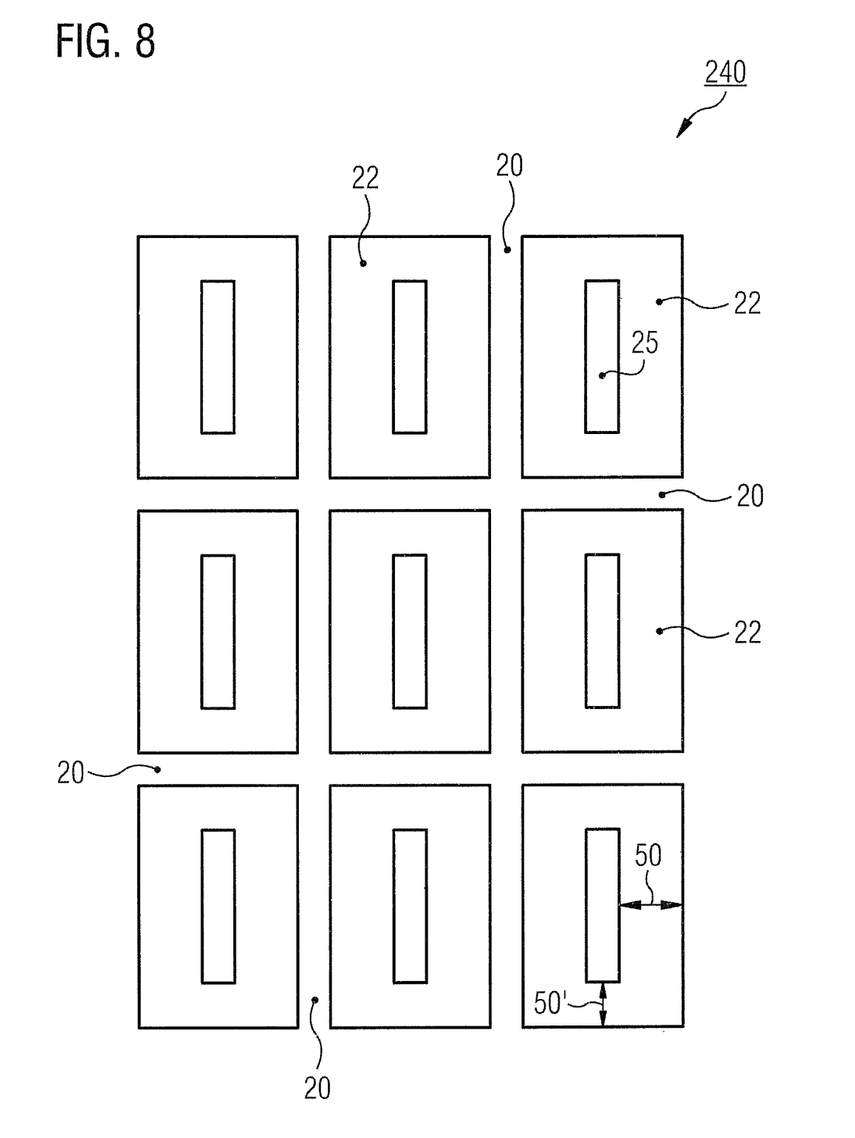
FIG. 8 shows a component assembly 240 according to a further illustrative embodiment in which the components 22 are configured in an O-shape.

For the sake of simplicity, respective mechanically retaining material webs (so-called connection elements or tethers) are not shown in FIGS. 6, 7 and 8 either, these material webs continuing to mechanically fix adjacent components 22 to one another to a certain extent, as has been explained with respect to FIG. 3.

FIG. 7 shows a component assembly 220 consisting of nine components 22, which each have provided therein two openings 25, 25' such that, also in this case, additional effective areas for the etch process are created on each component 22. The characteristics specified hereinbefore in connection with FIG. 6 exist here once more, so that the resultant width 50, which has to be under etched during the etch process, will be substantially smaller than in the case of conventional techniques. In addition, as regards the creation of respective sections, e.g. of sections 28, 29, which have been explained in connection with FIG. 6, the same aspects and advantages apply, so that a repetition of the description has here been dispensed with.

FIG. 8 shows a further embodiment 240, the components 22 in the field having here an O-shaped configuration. An opening 25 lies fully within the outer edges of each component 22, so that additional effective areas are created inside the component 22 without interrupting the etched trenches 20, which lead to a substantial reduction in width to an effective width 50 and 50'. The observations made hereinbefore in connection with sections 28, 29 of FIG. 6 apply in the same way also in this case to respective sections created by edge sections of the opening 25 and by respective outer edge sections of the components 22.

According to further non-depicted embodiments, the components 22 with respective shapes may be combined in an arbitrary manner, e.g. in the form of UUU, U∩ U∩, HHHH, OOOO, UHU, UOOO, HOHO, and similar permutations. This kind of variation may also be made in the second lateral y-direction.

According to other embodiments (not shown), each component 22 is divided into two or more parts. A respective part may here have one of the geometric designs shown hereinbefore, so that two or more different geometric designs will also exist e.g. within a single component 22.

It follows that components and their arrangement as well as methods are suggested, in which the technique of transferring components from a carrier substrate to a further substrate can be improved thereby (transfer print).

A more homogeneous etch process with reduced etching time is obtained. Or an etch process with a predetermined etching time but overall optimized area utilization.

In particular, the detachment of the components from the carrier substrate is managed efficiently, so that e.g. components with a larger total area can be detached reliably and transferred to a further carrier substrate (what was mentioned is from "A" to "B") in existing etching systems or by means of known etching strategies.

The invention claimed is:

1. A component assembly on a carrier substrate (10), comprising:
   a carrier substrate (10); and
   a plurality of components (22) comprising semiconductor material on the carrier substrate (10) and oriented as a two-dimensional field (200, 220, 240) in a first lateral direction (x) and a second lateral direction (y) of the carrier substrate, the second lateral direction (y) perpendicular to the first lateral direction (x);
   wherein each of the plurality of components comprises at least one opening (25, 25') that enlarges effective areas for etching free each of the plurality of components to fully etch free and detach them from the carrier substrate; and
   wherein each component, when viewed from a top view, comprises two or more sections configured in a U-shape, a H-shape, or an O-shape.

2. The component assembly according to claim 1, wherein the etching comprises at least one of vertical etching, underetching, lateral etching.

3. The component assembly according to claim 1, wherein a geometric design of each component having the opening (25, 25') increases the effective areas, so that the etching required for detaching a respective component has to cover a shorter distance.

4. The component assembly according to claim 1, wherein the effective areas for etching are enlarged for vertical etching, and then for underetching as lateral etching.

5. The component assembly according to claim 1, further comprising etched trenches that separate the plurality of components from each other (20) in the two-dimensional field.

6. The component assembly according to claim 1, wherein one of the components has provided therein at least one opening enlarging the effective area of etching.

7. The component assembly according to claim 1, wherein each component has provided therein at least one opening enlarging the effective area or the effective areas of etching.

8. The component assembly according to claim 1, wherein the at least one opening (25, 25') subdivides each component (22) into sections (28, 29) extending respectively in the first or second direction and delimited in their direction of extension by an outer edge section (27, 27') of the component and an opposed edge (26, 26') of the at least one opening (25, 25').

9. The component assembly according to claim 8, wherein for each section (28, 29) a distance (50) between a respective delimiting outer edge section (27, 27') and the opposed edge (26, 26') of the at least one opening is not larger than half the minimum total dimension of the component.

10. The component assembly according to claim 1, wherein two neighboring components (22, 22) are separated by an etched trench (20) having a predetermined nominal width.

11. The component assembly according to claim 10, wherein a minimum dimension of the at least one opening (25, 25') of each component corresponds to the nominal width of the etched trench (20).

12. The component assembly according to claim 1, wherein at least one of the plurality of components has a U-shape when viewed from above.

13. The component assembly according to claim 12, wherein each of the plurality of components has a U-shape when viewed from above.

14. The component assembly according to claim 1, wherein at least one of the plurality of components has an O-shape when viewed from above.

15. The component assembly according to claim 1, wherein at least one of the plurality of components has an H-shape when viewed from above.

* * * * *

UNITED STATES PATENT AND TRADEMARK OFFICE
CERTIFICATE OF CORRECTION

PATENT NO. : 10,845,710 B2
APPLICATION NO. : 15/951449
DATED : November 24, 2020
INVENTOR(S) : Ralf Lerner Page 1 of 1

It is certified that error appears in the above-identified patent and that said Letters Patent is hereby corrected as shown below:

On the Title Page

At (73) Assignee, replace the words "JPMORGAN CHASE BANK, N.A.," with the words --X-FAB SEMICONDUCTOR FOUNDRIES GMBH--

At (73) Assignee, replace the words "New York, NY (US)" with the words --Erfurt, (DE)--

Signed and Sealed this
Sixteenth Day of March, 2021

Drew Hirshfeld
*Performing the Functions and Duties of the
Under Secretary of Commerce for Intellectual Property and
Director of the United States Patent and Trademark Office*